(12) United States Patent
Gresham

(10) Patent No.: US 6,987,419 B2
(45) Date of Patent: Jan. 17, 2006

(54) ABSORPTIVE MICROWAVE SINGLE POLE SINGLE THROW SWITCH

(75) Inventor: Robert Ian Gresham, Somerville, MA (US)

(73) Assignee: M/A-Com, Inc., Lowell, MA (US)

( * ) Notice: Subject to any disclaimer, the term of this patent is extended or adjusted under 35 U.S.C. 154(b) by 62 days.

(21) Appl. No.: 10/614,495

(22) Filed: Jul. 7, 2003

(65) Prior Publication Data

US 2005/0007196 A1 Jan. 13, 2005

(51) Int. Cl.
*H03F 3/45* (2006.01)

(52) U.S. Cl. ...................... 330/254; 330/252
(58) Field of Classification Search ........... 330/254, 330/252, 292; 327/355, 359; 455/326, 333
See application file for complete search history.

(56) References Cited

U.S. PATENT DOCUMENTS

| 6,073,002 | A | * | 6/2000 | Peterson ............ 455/326 |
| 6,157,257 | A | | 12/2000 | Murphy ............ 330/252 |
| 6,393,260 | B1 | * | 5/2002 | Murtojarvi et al. ...... 455/91 |
| 6,518,842 | B1 | | 2/2003 | Carter et al. ......... 330/257 |
| 2002/0125924 | A1 | | 9/2002 | Kurogouchi et al. ..... 327/119 |
| 2003/0001677 | A1 | | 1/2003 | Taniguchi et al. ...... 330/285 |

FOREIGN PATENT DOCUMENTS

JP 58-181310 * 10/1983

* cited by examiner

*Primary Examiner*—Henry Choe

(57) ABSTRACT

A switch circuit including a first differential amplifier pair providing a portion of an isolation channel, a second differential amplifier pair providing a portion of a transmit channel, and a third differential amplifier pair providing a control bias for selecting either the transmit channel or the isolation channel. The switch circuit provides 35 dB isolation between input and output over a 15 GHz–26 GHz range, yet is only 500 μm by 250 μm in size.

18 Claims, 4 Drawing Sheets

ABSORPTIVE MICROWAVE SINGLE POLE SINGLE THROW SWITCH

FIELD OF THE INVENTION

This present invention relates to microwave switches, and in particular, to absorptive microwave switches.

BACKGROUND OF THE INVENTION

Absorptive switches are attractive components for a system designer, as the input, and ideally output, reflection coefficient of the switch remains constant regardless of the state of the switch. This reduces the effects of the switch on system parameters such as frequency pulling of a signal source, or the inducement of other transient effects that can be problematic in very short interval time-based systems.

One drawback of absorptive switches is that a dummy, or additional load, has to be included in the circuitry to be presented to the input network to absorb any incident energy when the switch is selected to be in a non-transmit or isolated state. This dummy load takes up valuable circuit board space in an integrated circuit (IC) design that directly translates to increased circuit cost and reduced yield.

Thus, there is presently a need for an absorptive switch which does not utilize a dummy load.

SUMMARY OF THE INVENTION

An embodiment of the present invention comprises a switch circuit including a first differential amplifier pair providing a portion of an isolation channel, a second differential amplifier pair providing a portion of a transmit channel, and a third differential amplifier pair providing a control bias for selecting either the transmit channel or the isolation channel.

An embodiment of the present invention also comprises a method for providing isolation between the input and output of a circuit comprising the steps of providing a first channel including at least one first differential amplifier pair, said first channel providing isolation between the input and output of the circuit, providing a second channel including at least one second differential amplifier pair, said second channel providing coupling between the input and output of the circuit, and providing a control bias which selects one of the first channel or the second channel.

DETAILED DESCRIPTION

An embodiment of the present invention comprises an absorptive microwave switch circuit that provides 35 decibels (dB) of isolation between input and output over 15 Gigahertz (GHz)–26 GHz range, yet is only 500 micrometers ($\mu$m) by 250 $\mu$m in size. Since 24 GHz has been used recently to provide pulsed radar systems for short-range automotive sensors, the present invention will be particularly applicable to such systems. The switch circuit ensures that there is almost no perceptible change in the input reflection coefficient between the transmission or absorptive states. In the transmit state the switch provides gain for the input signal between 14.2 GHz and 25.5 GHz, and has a 1 dB loss bandwidth of over 12 GHz. Lastly, the use of a constant current biasing scheme allows extremely fast switching between states allowing the switch to be used to generate pulses of 200 picoseconds (pS) in length with rise and fall times of approximately 60 pS. The entire switch, including biasing circuitry, requires only 12 milliamp (mA) from a +5 volt (V) supply.

As discussed above, the present invention will be particularly applicable to automotive sensing systems, which are required to detect objects at distances between 5 centimeters (cm) and 10 meters (m) to 30 m, often with a distance resolution of less than 10 cm. These requirements translate directly to a minimum inter-pulse period of less than 2 nanoseconds (nS) (correspond to the two-way flight time of a pulse reflected from an object 10 cm from the sensor), and a required pulse width of less than 500 pS. These design considerations require a circuit which has fast switching.

Figure 1:
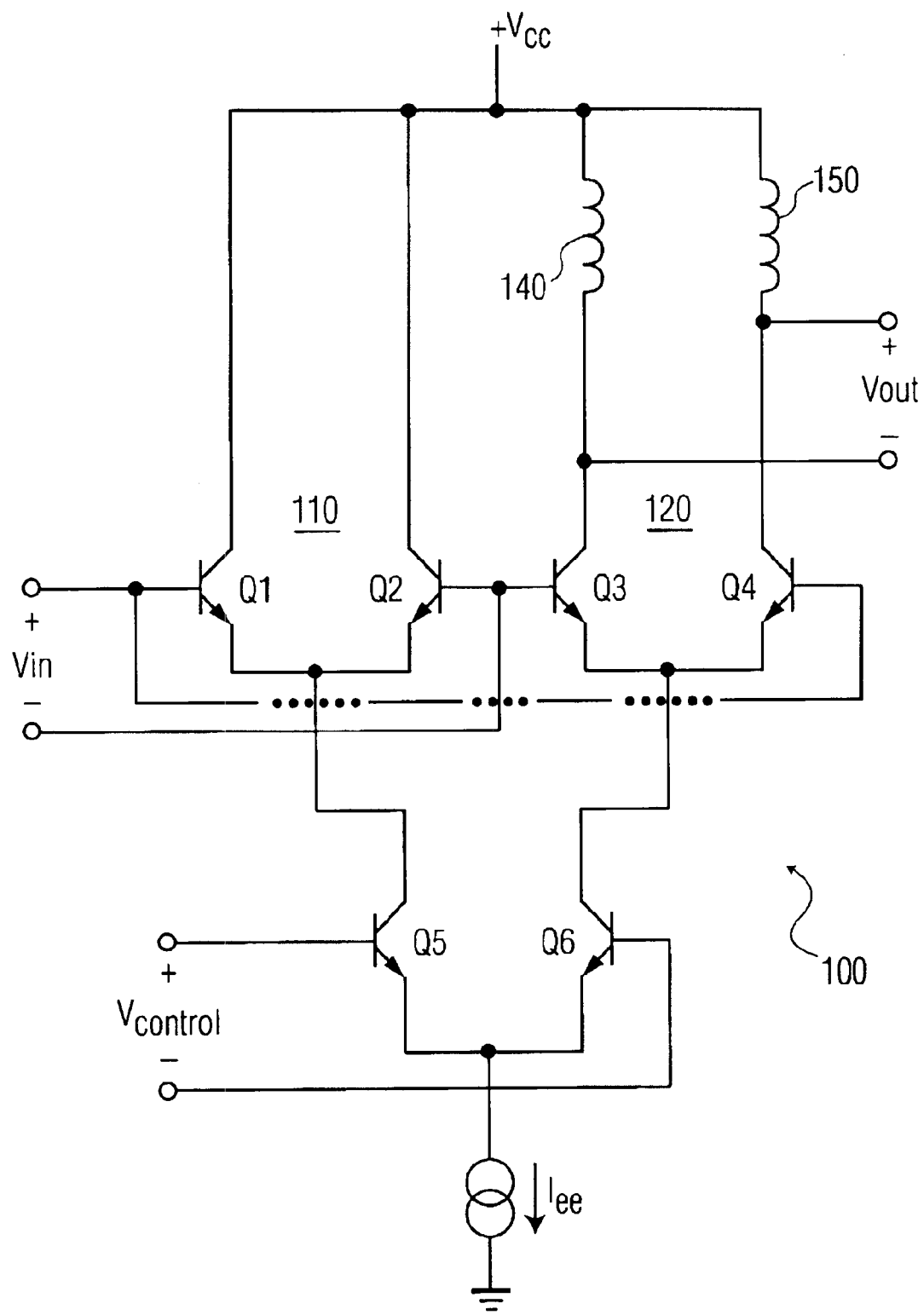
FIG. 1 shows switch circuit according to an exemplary embodiment of the present invention.

FIG. 1 shows an absorptive single pole single throw (SPST) switch circuit 100 according to an exemplary embodiment of the present invention which includes an input terminal $V_{in}$, and output terminal $V_{out}$, and a control terminal $V_{control}$. The switch circuit 100 also includes a first differential amplifier pair 110 including transistors Q1 and Q2, a second differential amplifier pair 120 including transistors Q3 and Q4, and a third differential amplifier pair 130 including transistors Q5 and Q6. The collectors of each of transistors Q1–Q4 are all coupled to a supply voltage $V_{cc}$. Transistors Q3 and Q4 further include inductors 140, 150 coupled between the collectors and $V_{cc}$. The collector of transistor Q5 is coupled to the emitters of transistors Q1 and Q2, and the collector of transistor Q6 is coupled to the emitters of transistors Q3 and Q4. The emitters of transistors Q5 and Q6 are coupled to a current source $I_{ee}$.

In operation, transistor Q6 is biased on by control signal $V_{control}$ to select the "transmit" state of the switch 100. This is accomplished by providing a control signal $V_{control}$ which is above the junction voltage of transistor Q6 on the negative side (e.g., −0.7 volts). In the "transmit" state, signals entering input terminal $V_{in}$ are coupled to output terminal $V_{out}$. The biasing on of transistor Q6 in turn biases on transistors Q3 and Q4, thus creating a signal path from the input terminal $V_{in}$ to the output terminal $V_{out}$ at the respective collectors of transistors Q3 and Q4. Thus, the input signal is transmitted to the output.

Alternatively, if $V_{control}$ selects the "isolation" state of the switch 100 by biasing transistor Q5 on, signals entering input terminal $V_{in}$ are decoupled from output terminal $V_{out}$. As with the "transmit" state, this is accomplished by providing a control signal $V_{control}$ which is above the junction voltage of transistor Q5 on the positive side (e.g., +0.7 volts). The biasing on of transistor Q5 in turn biases on transistors Q1 and Q2, and thus creates a signal path from the input terminal $V_{in}$ to the midpoint between the bases of transistors Q2 and Q3. Accordingly, the input is "isolated" from the output.

In the "transmit" state, the high input impedance of the transistor pair Q1, Q2 when turned off minimizes the circuit loading on Q3 and Q4, and the circuit appears as a standard differential amplifier, that when matched, can provide gain to an input signal. Bias chokes in the form of inductors 140, 150 used to isolate the DC voltage supply $V_{cc}$ from the output microwave signal $V_{out}$.

In the "isolation" state, the high impedance presented by Q3 and Q4 is such that they load input circuit only lightly. The input voltage $V_{in}$ is transferred primarily to the Q1, Q2 pair where it sees a virtual RF ground. The differential pair Q1, Q2 can thus be considered as an ideal unilateral amplifier.

The switch circuit 100 provides for several advantages. First, the control signal $V_{control}$ applied differentially across transistors Q5 and Q6 allows for easy selection of either the transmission or isolated state. Additionally, the constant current steering between the two differential amplifier pairs 110, 120 ensures extremely high speed switching between the two states, as the switch never has to be depleted of high current densities. In particular, the switch circuit provides a pulse width of approximately 220 pS, with rise and fall times around 60 pS at 24 GHz.

The switch circuit 100 may be implemented using any commercially available transistor based semiconductor process, such as a Silicon Germanium (SiGe) process (e.g., Atmel SiGE2basic).

Figure 2:
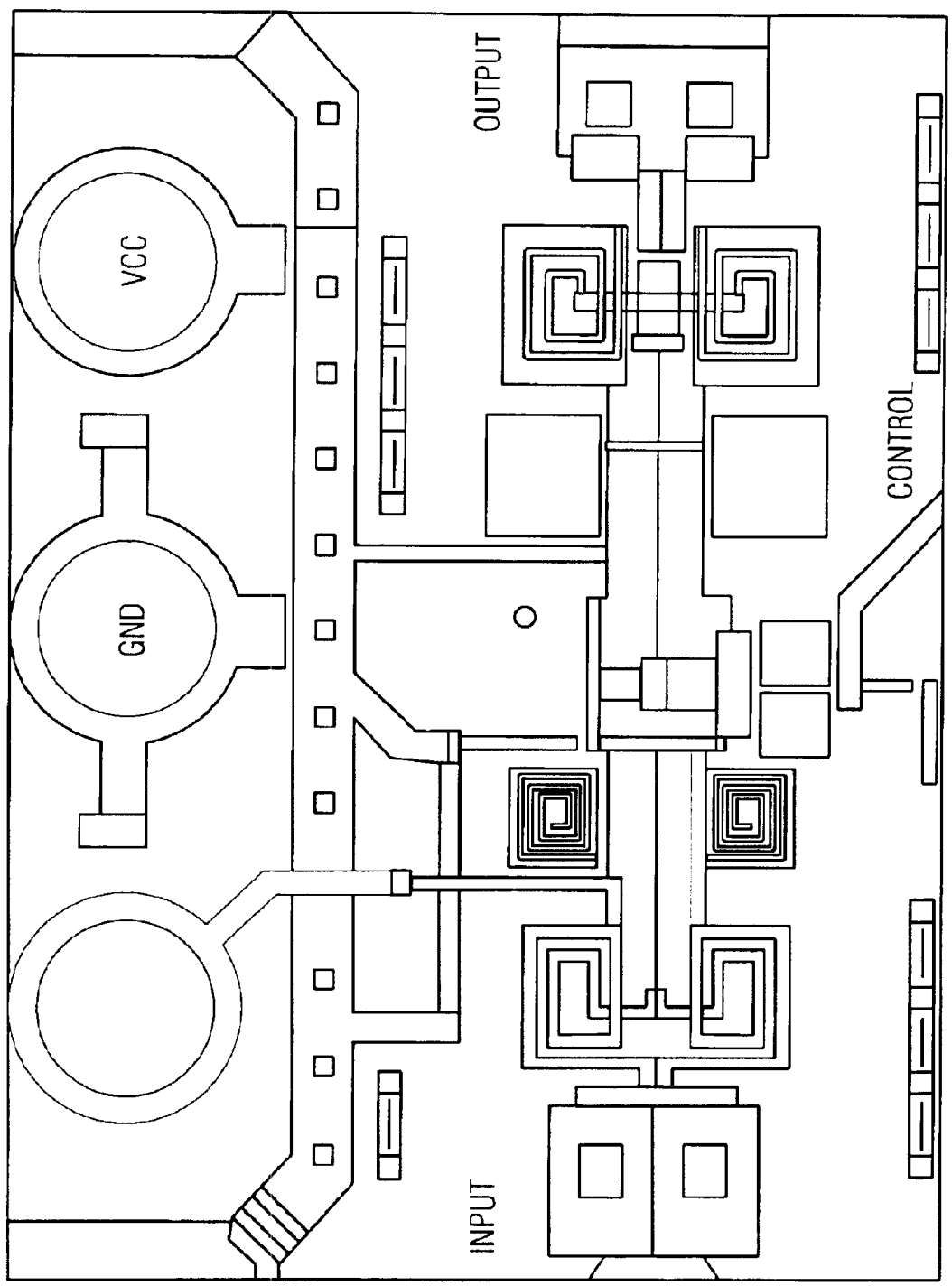
FIG. 2 shows the switch circuit of FIG. 1 implemented as an integrated circuit.

FIG. 2 shows a photograph of the switch circuit 100 of FIG. 1 implemented in SiGe. As should be understood by those of ordinary skill in the art, the switch circuit 100 may be implemented in other substrates as well, such as Silicon Gallium Arsenide (SiGaAs) or Indium Phosphide (InP). As shown in FIG. 2 the switch circuit also includes input and output matching networks (not shown in the idealized circuit diagram of FIG. 1) comprising a series of inductors and resistors designed for operation at a center frequency of 24 GHz. The first and second differential amplifier pairs 110, 120 are disposed adjacent to each other and connected in parallel across an input signal network. The collectors of Q3–Q4 are connected to an output-matching network, while the collectors of Q1–Q2 are connected directly together and further connected directly to source voltage $V_{cc}$. The total circuit area of the switch circuit shown in FIG. 2 including input and output matching networks and bias circuits is 500 µm by 250 µm.

Figure 3A:
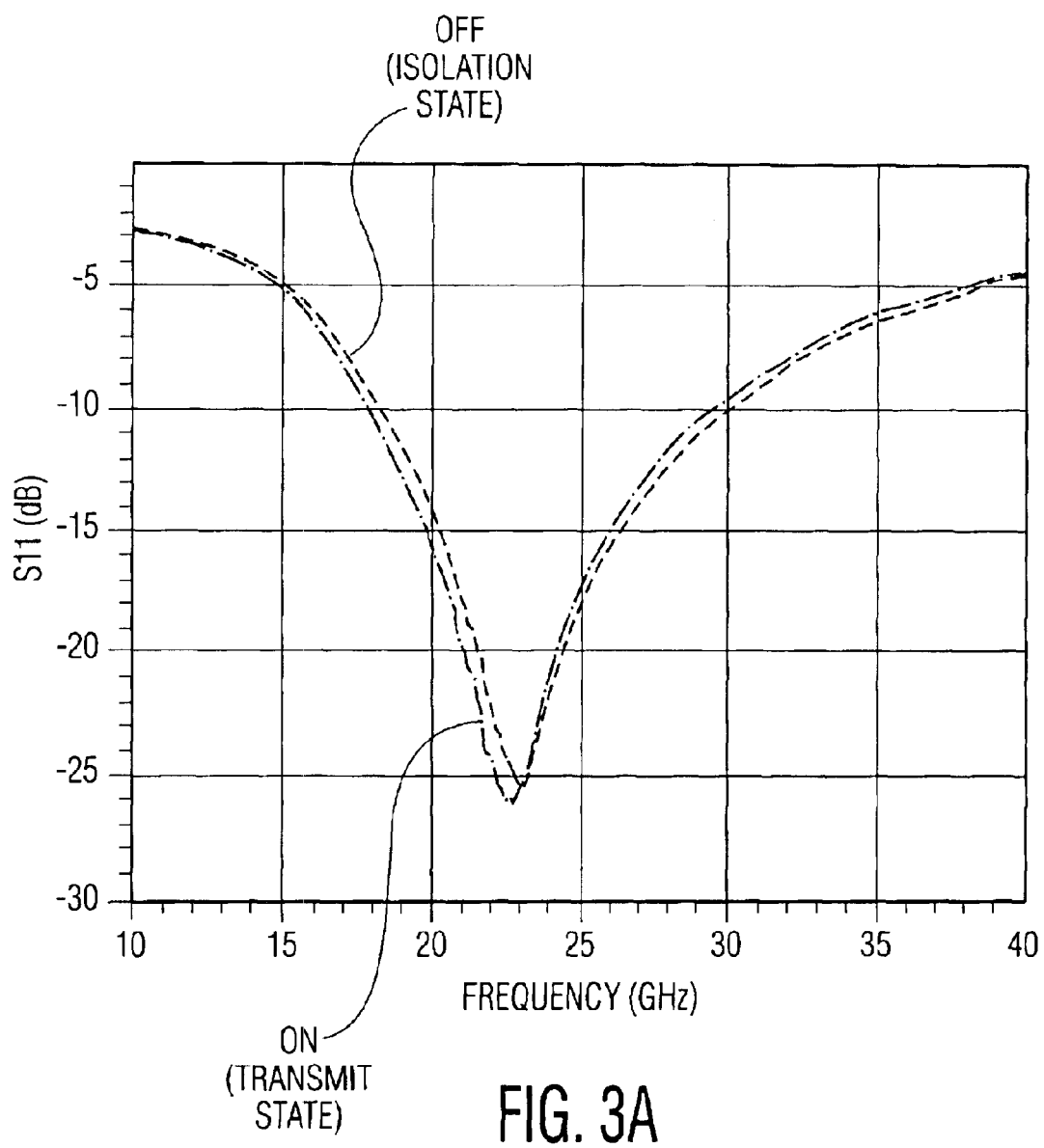
FIG. 3(a) is a graph showing a frequency versus decibel (dB) response of the input reflection coefficient for the switch circuit of FIG. 1 in both the isolated and transmission states.
Figure 3B:
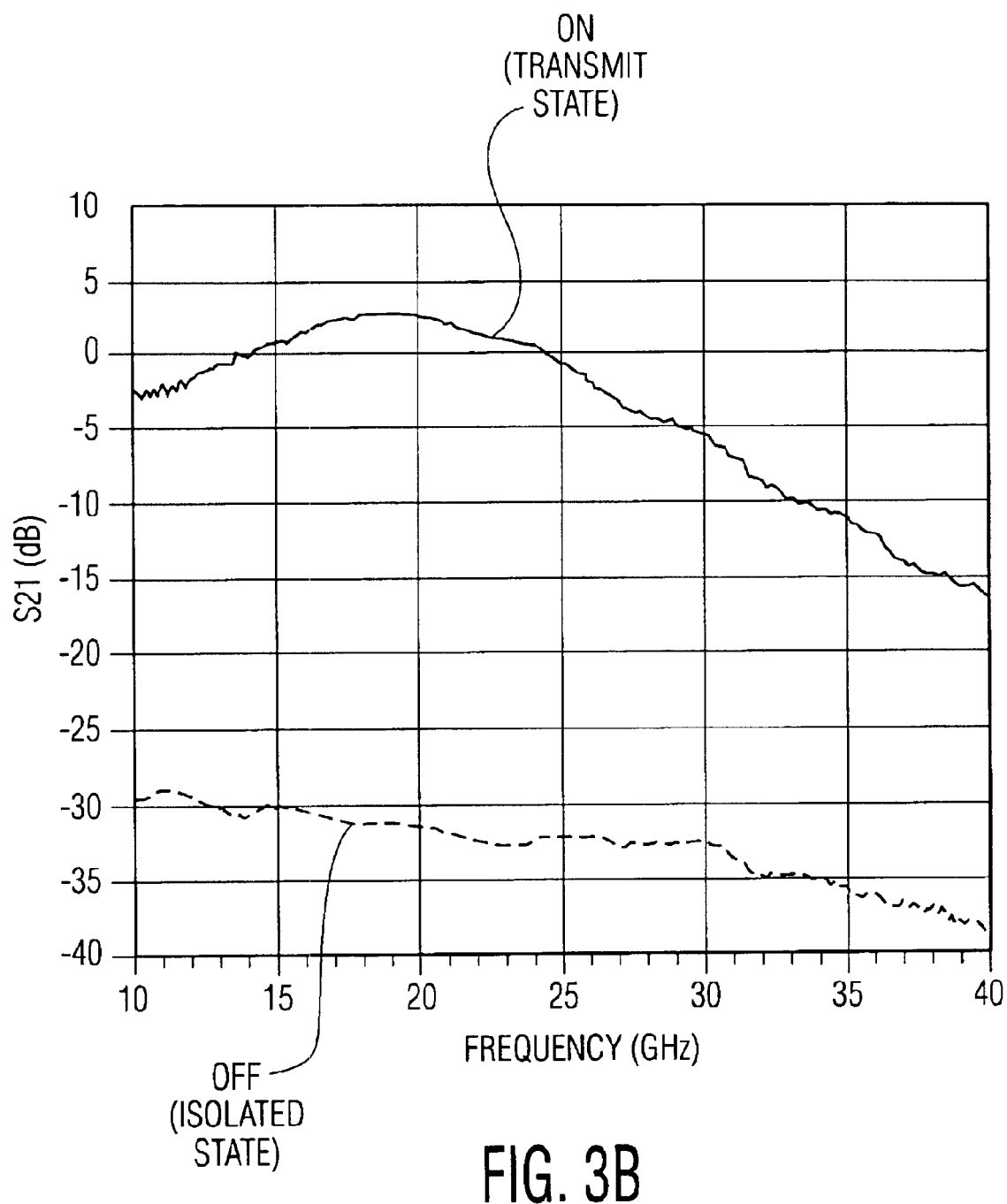
FIG. 3(b) is a graph showing shows a frequency versus decibel (dB) response of the transmission characteristics for the switch circuit of FIG. 1 when the switch circuit is in alternately the isolated and the "transmit" states.

FIG. 3(a) shows the input reflection coefficient of the switch circuit 100 in both its transmission and absorption (isolation) states. The difference between the reflection coefficients in each state is extremely small, as the DC current flowing through the network has remained constant. This validates using the virtual radiofrequency (RF) ground of the differential pair Q1–Q2 as a load rather than the more conventional technique of steering the input signal into a matched load to provide the absorptive condition. In the transmit state, shown in FIG. 3(b), an ON-OFF ratio of over 30 dB is achieved over 14 GHz–28 GHz, and a 1 dB insertion-loss bandwidth of over 12 GHz is measured.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A switch circuit comprising:
a first differential amplifier pair providing a portion of an isolation channel, wherein a first amplifier of the first differential amplifier pair is coupled to a first differential input terminal, and a second apmplifier of the first differential amplifier pair is coupled to a second differential input terminal;
a second differential amplifier pair providing a portion of a transmit channel, wherein a first amplifier of the second differential amplifier pair is coupled to a first differential output terminal, and a second amplifier of the second differential amplifier pair is coupled to a second differential output terminal; and
a third differential amplifier pair providing a control bias for selecting either the transmit channel or the isolation channel.

2. The switch circuit of claim 1, further comprising:
an input terminal coupled to the first differential amplifier pair and the second differential amplifier pair; and
an output terminal coupled to the second differential amplifier pair.

3. The switch circuit of claim 2, further comprising:
a control terminal coupled to the third differential amplifier pair.

4. The switch circuit of claim 3, wherein the control terminal provides a bias voltage to the third differential amplifier pair to enable one of two transistors within the differential amplifier pair.

5. The switch circuit of claim 1, wherein a first transistor of the third differential amplifier pair is disposed in the transmit channel, and a second transistor of the third differential amplifier pair is disposed in the isolation channel.

6. The switch circuit of claim 5, wherein enabling the first transistor permits an input signal to proceed to an output terminal of the circuit, and enabling the second transistor prohibits an input signal from proceeding to the output terminal.

7. The switch circuit of claim 1, wherein the circuit is formed as an integrated circuit on one of a Silicon Germanium, Silicon Gallium Arsenide or Indium Phosphide substrate.

8. The switch circuit of claim 1, wherein each of the first and second differential amplifier pairs comprise at least two transistors with their emitters coupled.

9. The switch circuit of claim 1, wherein the second differential amplifier pair comprises at least two transistors, wherein at least one inductor is coupled to each of the respective collectors of the at least two transistors.

10. The switch circuit of claim 1, wherein a pulse width of the control bias is less than 500 picoseconds.

11. The switch circuit of claim 1, wherein a pulse width of the control bias is between 200–300 picoseconds.

12. A method for providing isolation between the input and output of a circuit comprising the steps of:
providing a first channel including at least one first differential amplifier pair, said first channel providing isolation between the input and output of the circuit, wherein a first amplifier of the first differential amplifier pair is coupled to a first differential input terminal, and a second amplifier of the first differential amplifier pair is coupled to a second differentila input terminal;
providing a second channel including at least one second differential amplifier pair, said second channel providing coupling between the input and output of the circuit, wherein a first amplifier of the second differential amplifier pair is coupled to a first differentiald output terminal, and a second amplifier of the second differential amplifier pair is coupled to a second differential output terminal; and
providing a control bias which selects one of the first channel or the second channel.

13. The method of claim 12, wherein the step of providing a control bias comprises supplying a control voltage to bases of a differential amplifier pair.

14. The method of claim 13, wherein a pulse width of the control voltage is less than 500 picoseconds.

15. The method of claim 13, wherein a pulse width of the control voltage is between 200–300 picoseconds.

16. The method of claim 12, wherein said first channel provides isolation between said signal input and said signal output over a 15 GHz to 26 GHz range.

17. The method of claim 12, wherein said second channel provides gain between said signal input and said signal output over a 14 GHz to 28 GHz range.

18. The method of claim 12, wherein said control bias is supplied by a DC current source.

* * * * *